United States Patent [19]
Hachisuka et al.

[11] Patent Number: 5,627,093
[45] Date of Patent: May 6, 1997

[54] METHOD OF MANUFACTURING A WIRING LAYER FOR USE IN A SEMICONDUCTOR DEVICE HAVING A PLURALITY OF CONDUCTIVE LAYERS

[75] Inventors: Atsushi Hachisuka; Yoshinori Okumura, both of Hyogo-ken, Japan

[73] Assignee: Mitsubishi Denki Kabushiki Kaisha, Tokyo, Japan

[21] Appl. No.: 463,809

[22] Filed: Jun. 5, 1995

Related U.S. Application Data

[62] Division of Ser. No. 363,548, Dec. 23, 1994, Pat. No. 5,502,324, which is a continuation of Ser. No. 220,587, Mar. 31, 1994, abandoned, which is a continuation of Ser. No. 75,909, Jun. 14, 1993, abandoned, which is a continuation of Ser. No. 814,274, Jan. 2, 1992, abandoned.

[30] Foreign Application Priority Data

Jan. 8, 1991 [JP] Japan ............... 3-719(P)

[51] Int. Cl.$^6$ .................. H01L 21/70; H01L 27/00
[52] U.S. Cl. ................. 438/649; 438/666; 438/586; 438/396
[58] Field of Search .................. 437/200, 919, 437/52, 60; 148/DIG. 147

[56] References Cited

U.S. PATENT DOCUMENTS

| | | | |
|---|---|---|---|
| 4,780,394 | 10/1988 | Blanchard et al. | 257/413 |
| 4,847,674 | 7/1989 | Sliwa et al. | 257/775 |
| 5,005,068 | 4/1991 | Ikeda et al. | 257/904 |
| 5,031,008 | 7/1991 | Yoshida | 257/413 |
| 5,113,238 | 5/1992 | Wang et al. | 357/23.6 |
| 5,120,674 | 6/1992 | Chin et al. | 437/52 |
| 5,124,280 | 6/1992 | Wei et al. | 437/200 |
| 5,262,343 | 11/1993 | Rhodes et al. | 437/52 |

FOREIGN PATENT DOCUMENTS

| | | | |
|---|---|---|---|
| 0235469 | 11/1985 | Japan . | |
| 0284857 | 11/1988 | Japan . | |
| 2-32544 | 2/1990 | Japan | 257/767 |
| 2-271628 | 11/1990 | Japan | 257/767 |
| 2139418 | 5/1983 | United Kingdom . | |

OTHER PUBLICATIONS

Chen et al., "A New Device Interconnect Scheme for Sub–Micron VLSI," IEDM 1984, pp. 118–121.

Yang et al., "The Impact of Titanium Silicide on the Contact Resistance for Shallow Junction Formed by Out–Diffusion of Arsenic from Polysilicon," Ext. Abstracts of the 1992 Int. Conf. on Solid State Devices and Materials, Tsukuba, 1992, pp. 413–415.

*Primary Examiner*—H. Jey Tsai
*Attorney, Agent, or Firm*—Lowe, Price, LeBlanc & Becker

[57] ABSTRACT

An electrode wiring layer of a semiconductor device according to this invention includes a first conductive portion formed of polycrystalline silicon or the like, and second conductive portions formed as refractory metal silicide layers on opposite lateral walls of the first conductive portion. Upper surfaces and lateral surfaces thereof are coated with insulating layers formed in separate processes. The insulating layers covering the lateral surfaces in particular are formed by a self-aligning technique requiring no mask process. Where conductive layers are formed over the wiring layer according to this invention, a film forming and patterning process for insulating the conductive portions of the wiring layer is omitted and insulation of the wiring layer is secured.

9 Claims, 11 Drawing Sheets

5,627,093

METHOD OF MANUFACTURING A WIRING LAYER FOR USE IN A SEMICONDUCTOR DEVICE HAVING A PLURALITY OF CONDUCTIVE LAYERS

This application is a division of application Ser. No. 08/363,548 filed Dec. 23, 1994, U.S. Pat. No. 5,502,324, which is a continuation of application Ser. No. 08/220,587 filed Mar. 31, 1994, abandoned, which is a continuation of application Ser. No. 08/075,909 filed Jun. 14, 1993, abandoned, which is a continuation of application Ser. No. 07/814,274 filed Jan. 2, 1992, abandoned.

BACKGROUND OF THE INVENTION

1. Field of the Invention

This invention relates to wiring layers having structure suited for use as electrode wiring in a semiconductor device having a highly integrated structure, and to a method of manufacturing such wiring layers.

2. Description of the Background Art

In the field of semiconductor devices, element structures are becoming increasingly miniaturized and integrated to meet the demands for greater capacity and performance. A semiconductor device includes numerous electrode layers and wiring layers, and these conductive layers are patterned to fine structures to meet the demand for a greater scale of integration. The demand for miniaturization of wiring layers has led to a reduction in conductive area of the wiring layers and a reduction in contact regions with certain other conductive regions. Consequently, various measures have been taken to reduce or suppress an increased wiring resistance resulting therefrom.

One such measure is use of a highly conductive material as a wiring material. There is, for example, a wiring structure having a refractory metal silicide layer formed on a surface of a polycrystalline silicon layer. Such a wiring structure will be described hereinafter. The description will be made in relation to a memory cell structure of a DRAM as a specific example in which such a wiring structure is employed.

FIG. 22 is a sectional view of a memory cell structure of a conventional DRAM. A memory cell forms a minimum unit for storing unit information, and is made up of one transfer gate transistor 3 and one capacitor 10. This DRAM has a plurality of memory cells arranged in matrix form on a substrate to provide a large capacity storage region. A memory cell array forming the storage region includes a plurality of word lines 4 extending parallel to one another, and a plurality of bit lines 15 extending perpendicular thereto. Each memory cell is isolated on a surface of a silicon substrate 1 by a field oxide layer 2.

The transfer gate transistor 3 includes a gate electrode 4 formed of part of a word line, a pair of impurity regions 6, and a gate insulating layer 5 interposed between the silicon substrate 1 and gate electrode 4. The capacitor 10 has a multi-layer structure including a lower electrode 11, a dielectric layer 12 and an upper electrode 13. The gate electrode (word line) 4 is surrounded by an insulating layer 7.

There is a strong demand particularly for increases in the capacity of such memory cells of DRAMs, and miniaturization of the element structure is an important technical problem to be solved for meeting this demand. The demand for miniaturization of the structure has led to a reduced gate length of the transfer gate transistor 3 on the order of submicrons. Consequently, it is inevitable for the gate electrode 4 to have a reduced sectional area. In the structure shown in FIG. 22, therefore, the gate electrode (word line) 4 has a layered structure including a polycrystalline silicon layer 4a used widely heretofore, and a titanium-silicide layer 4b formed in a self-aligning manner on an upper surface and lateral surfaces of the silicon layer 4a. The titanium-silicide layer 4b has a higher conductivity than the polycrystalline silicon layer 4a. Thus, conductivity is improved with the illustrated electrode 4 compared with a gate electrode formed of polycrystalline silicon and having an equal sectional area.

A process of manufacturing the above memory cells will be described next. FIGS. 23 through 29 are sectional views illustrating a conventional memory cell manufacturing process.

Referring to FIG. 23 first, the field oxide layer 2 is formed in a predetermined region on a surface of the silicon substrate 1, using the LOCOS (Local Oxidation of Silicon) method.

Referring to FIG. 24 next, the gate insulating layer and polycrystalline silicone layer are formed successively on the surface of silicon substrate 1. The polycrystalline silicon layer is patterned to a predetermined shape to form first conductive layers 4a of the gate electrodes (word lines).

Referring to FIG. 25, a titanium layer 25 is formed on the silicon substrate by the spattering method.

Referring to FIG. 26, a heat treatment is effected to produce a silicide reaction in regions of the titanium layer 25 contacting the surfaces of polycrystalline silicon layers (first conductive portions) 4a, thereby forming the titanium silicide layers 4b. This provides the second conductive portion of each gate electrode 4. Thereafter the unreacted parts of the titanium layer 25 are removed.

Referring to FIG. 27, impurities are ion-implanted into the silicon substrate 1, using the gate electrode 4 as a mask, to form the pair of source/drain regions 6. Thereafter an insulating layer 70 such as of oxide film is placed over the entire surface.

Referring to FIG. 28, a resist pattern 20 having a predetermined opening pattern is formed by photolithography and etching. This resist pattern 20 is used as a mask to etch away the insulating layer 70, thereby forming an opening 21 reaching one of the source/drain regions 6. One problem arises from this process. It is an error occurring in mask alignment when forming the resist pattern 20. A solid line in FIG. 28 indicates a desired shape of the resist pattern 20 having the opening 21. However, the error in alignment between the silicon substrate 1 and resist mask for forming the resist pattern 20 is inevitable. As a consequence, the opening 21 of the resist pattern 20 may be deviated. Especially, with development of the large scale integration technique, the source/drain region 6 now has a reduced range of transverse diffusion on the order of submicrons. This results in an increased chance of a deviation 22 occurring in the mask alignment. When the deviated resist pattern 20 is used as a mask in etching the insulating layer 70, the part of insulating layer 70b covering an upper part or lateral surface of the gate electrode 4 is etched away, thereby exposing a surface of the second conductive portion 4b of the gate electrode 4.

Referring to FIG. 29, after covering the gate electrodes 4 with the insulating layer 7 in the above process, the lower electrode of capacitor 10 is formed in a way to connect with the source/drain region 6. Thereafter the capacitor 10 is completed by forming the dielectric layer 12 and upper electrode 13. When the mask deviation occurs with the resist pattern 20 in the foregoing process to expose part of the second conductive portion 4b of gate electrode 4, a short-circuiting situation arises from contact between the lower electrode 11 of capacitor 10 and the second conductive portion 4b of gate electrode 4.

As exemplified by the word lines of the DRAM, the conventional layered wiring structure of the polycrystalline silicon layer and silicide layer has the following disadvantage. When forming a conductive layer over the layered wiring with an insulating layer in between, the conductive layer covering the wiring is patterned using a mask process such as photolithography. Part of the insulating layer completely covering the wiring may be etched as a result of a mask alignment error, thereby producing defective coating. And the defect in the insulation coating of the wiring causes a defect in the insulation with the conductive layer.

SUMMARY OF THE INVENTION

An object of this invention is to provide a wiring layer having an insulating structure capable of preventing surfaces of conductive layers from becoming exposed during a manufacturing process.

Another object of this invention is to provide a method of manufacturing a wiring layer in which conductive layers having a plurality of conductive materials are coated with insulating layers in a self-aligning manner.

A wiring layer for a semiconductor device according to this invention includes a first conductive layer extending in a predetermined direction, and second conductive layers formed on lateral surfaces of the first conductive layer. An upper insulating layer is formed to cover upper surfaces of the first conductive layer and second conductive layers, and lateral insulating layers are formed to cover only lateral surfaces of the second conductive layers.

A wiring layer for a semiconductor device according to this invention is manufactured by the following process. A first conductive layer and a first insulating layer are formed first on an insulating layer. Next, the first conductive layer and first insulating layer are patterned to predetermined shapes. Then, second conductive layers are formed on lateral walls of the first conductive layer. A second insulating layer is thereafter formed on surfaces of the first insulating layer and the second conductive layers, and the second insulating layer is etched to leave parts of the second insulating layer on lateral surfaces of the second conductive layers.

The first conductive layer and second conductive layers formed laterally thereof act as conductive parts of the wiring. The insulating layers coating the wiring layer may be formed without using a mask process, by independently forming the upper insulating layer and lateral insulating layers.

The foregoing and other objects, features, aspects and advantages of the present invention will become more apparent from the following detailed description of the present invention when taken in conjunction with the accompanying drawings.

DETAILED DESCRIPTION OF THE PREFERRED EMBODIMENTS

An embodiment of this invention will be described hereinafter with reference to the drawings. The structure of an electrode wiring layer according to this invention is not limited in its application to a particular semiconductor device but has wide applicability. In the embodiment set out hereunder, the structure according to this invention is applied to word lines or bit lines by way of example.

Figure 1:
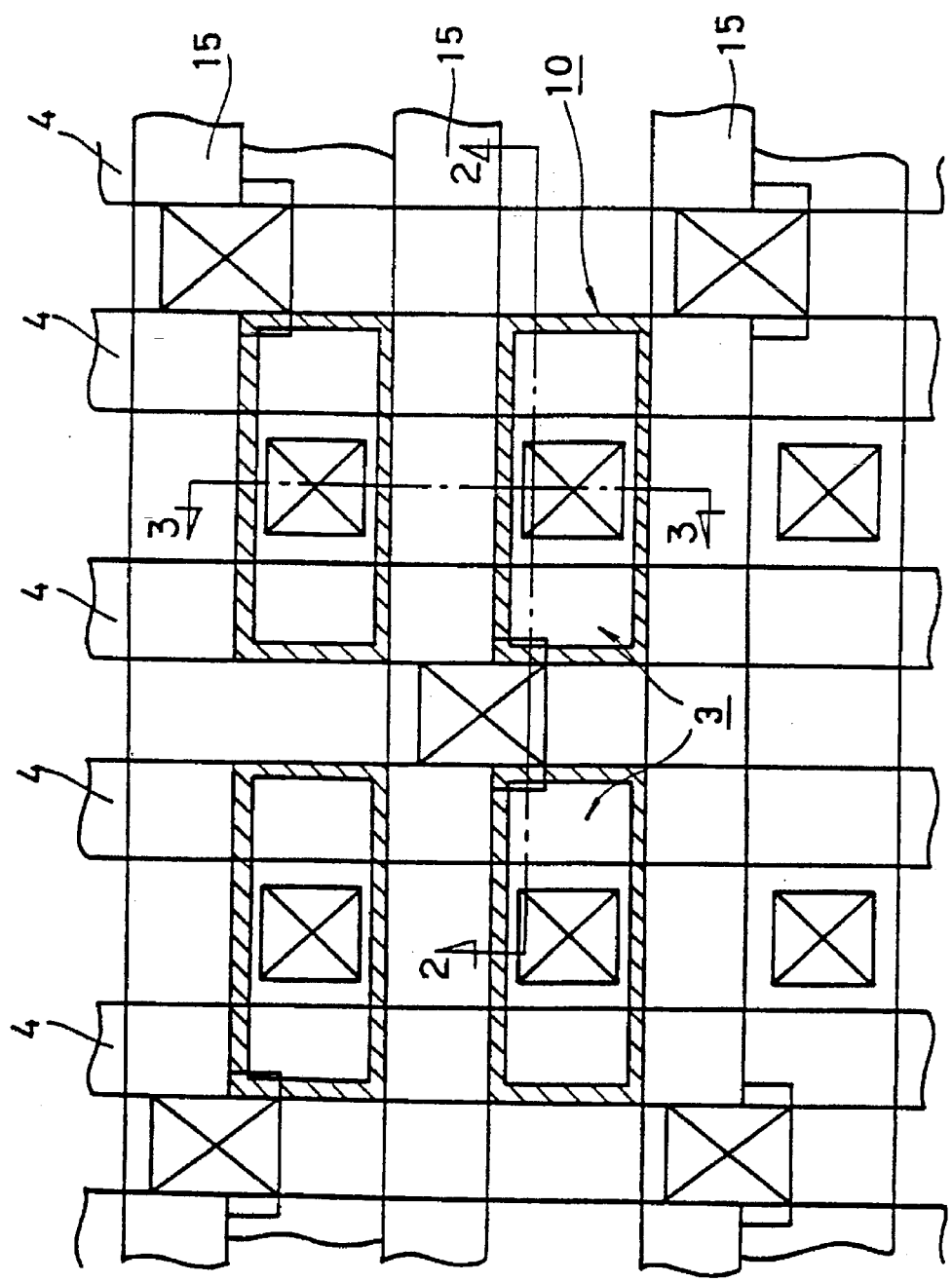
FIG. 1 is a structural plan view of memory cells of a DRAM embodying this invention.
Figure 2:
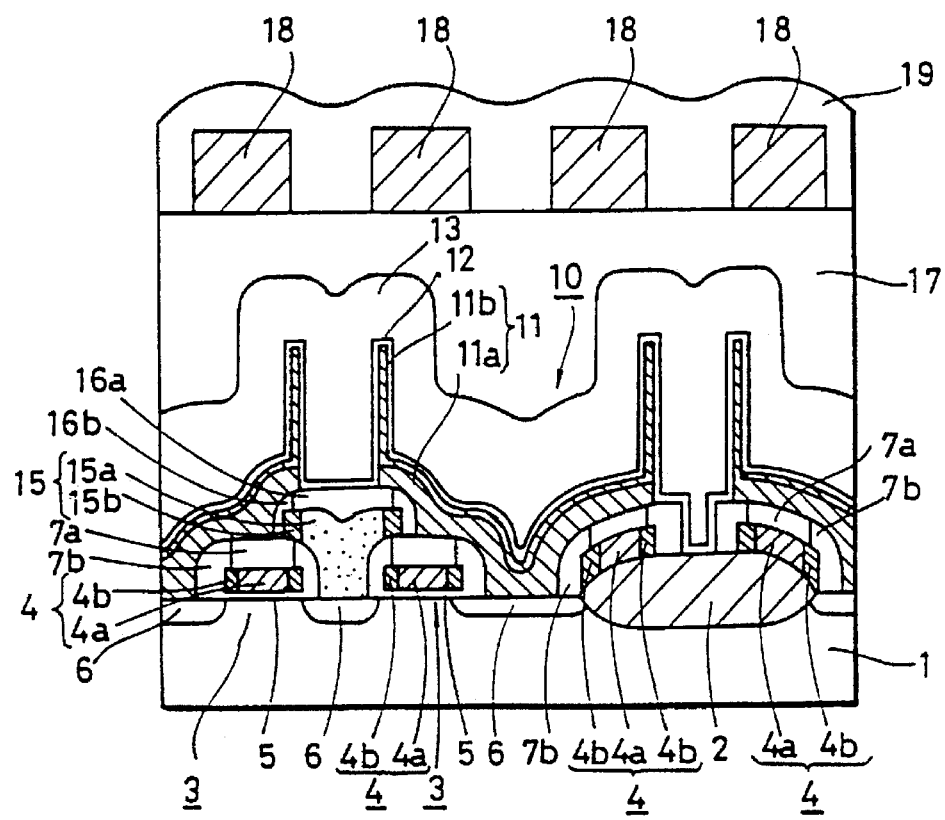
FIG. 2 is a structural section taken on line 2—2 in FIG. 1.
Figure 3:
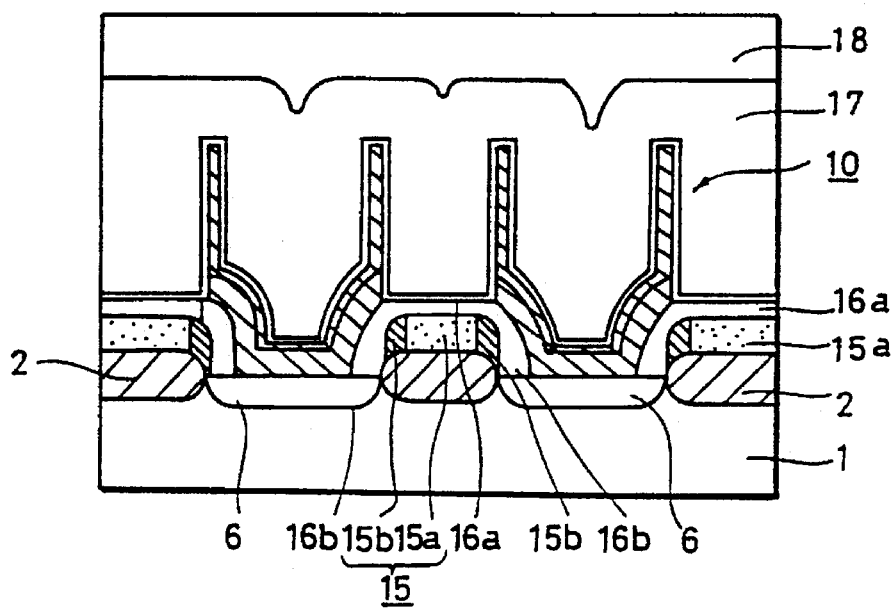
FIG. 3 is a structural section taken on line 3—3 in FIG. 1.

A memory cell structure of a DRAM will be described first referring to FIGS. 1 through 3. A plurality of word lines 4 extending in a predetermined direction and a plurality of bit lines 15 extending perpendicular thereto are arranged in matrix form on a surface of a silicon substrate 1. A plurality of memory cells are also arranged in matrix form along the word lines 4 and bit lines 15. Each memory cell includes one transfer gate transistor 3 and one capacitor 10. The transfer gate transistor 3 includes a gate electrode (word line) 4 formed on the surface of silicon substrate 1 with a gate insulating layer 5 in between, and a pair of source/drain regions 6. The capacitor 10 has a multi-layer structure including a lower electrode 11, a dielectric layer 12 and an upper electrode 13. The lower electrode 11 of the capacitor 10 includes a base portion 11a having a relatively flat configuration, and an upstanding wall portion 11b projecting vertically upwardly. Such a structure provides an enlarged surface area of the capacitor to increase the capacity of the capacitor 10. Upper portions of the capacitor 10 are covered with a first interlayer insulating layer 17. Wiring layers 18 are formed on the surface of the first interlayer insulating layer 17. Further, a second interlayer insulating layer 19 is formed to cover the wiring layers 18. The bit lines 15 are formed to extend perpendicular to the word lines 4 and in positions below upper ends of the capacitors 10. Such a structure is known as a buried bit line structure. The bit lines 15 are connected to one of the source/drain regions 6 of each transfer gate transistor 3.

Each gate electrode (word line) 4 includes a first conductive portion 4a formed of polycrystalline silicon containing impurities, and second conductive portions 4b formed of titanium silicide, for example, and extending along opposite lateral surfaces of the first conductive portion 4a. Upper parts of the gate electrode 4 are covered with an upper insulating layer 7a formed of silicon oxide film or the like, while lateral parts thereof are covered with lateral insulating layers 7b also formed of silicon oxide film or the like. These upper insulating layer 7a and lateral insulating layers 7b secure insulation between bit line 15 and gate electrode 4.

As does the gate electrode 4, each bit line 15 includes a first conductive portion 15a formed of polycrystalline silicon or the like, and second conductive portions 15b formed of titanium silicide or the like and extending along opposite lateral surfaces of the first conductive portion 15a. The second conductive portions 15 are not formed on lateral surfaces of contact parts. An upper insulating layer 16a is formed along upper parts of the bit line 15, while lateral insulating layers 16b are formed along lateral surfaces thereof. These upper insulating layer 16a and lateral insulating layers 16b secure insulation from the lower electrode 11 of the capacitor 10, for example.

Compared with a wiring layer formed, for example, of polycrystalline silicon alone, the structure of word lines (gate electrodes) 4 or bit lines 15 in this embodiment has improved conductivity due to the refractory metal silicide layers, and improved insulation due to coating of upper and lateral positions thereof with the independent insulating layers.

A process of manufacturing the above memory cells including the word lines and bit lines will be described next. FIGS. 4 through 15 are sectional views corresponding to the sectional structure shown in FIG. 2 and illustrating the manufacturing process. FIGS. 16 through 21 are sectional views corresponding to the sectional structure shown in FIG. 3 and illustrating the manufacturing process. In the manufacturing process shown in FIGS. 4 through 15, the manufacturing steps shown in FIGS. 4 through 10 relate to formation of the word lines (gate electrodes) 4, while the steps shown in FIGS. 11 through 15 relate mainly to formation of the bit lines 15. FIGS. 16 through 21 correspond to the bit line manufacturing steps shown in FIGS. 11 through 15.

Figure 4:
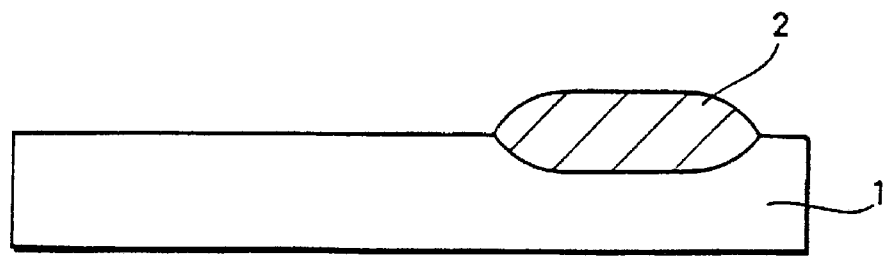
FIGS. 4 through 15 are sectional views showing a manufacturing process of the memory cells shown in FIG. 2.

Referring to FIG. 4 first, the field oxide layer 2 is formed thick in a predetermined region on a surface of the silicon substrate 1, using the LOCOS method.

Figure 5:
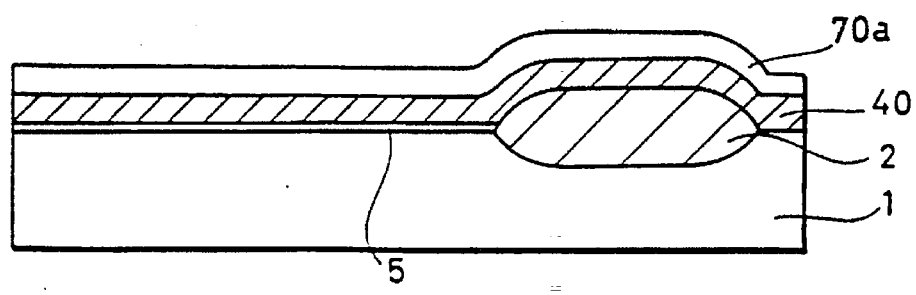

Referring to FIG. 5 next, the gate insulating layer 5 is formed of oxide film or nitride film on the surface of silicon substrate 1. Further, a polycrystalline silicon layer 40 is superposed on the surface thereof by the CVD (Chemical Vapor Deposition) method. Then, an insulating layer 70a is formed of silicon oxide film, silicon nitride film or the like on the surface of polycrystalline silicon layer 40 by the CVD method.

Figure 6:
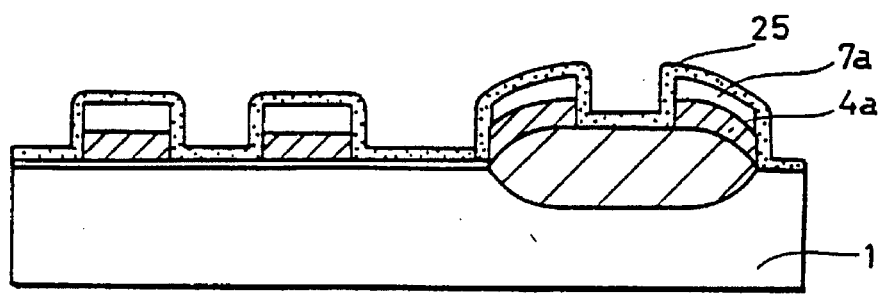

Referring to FIG. 6, the insulating layer 70a and polycrystalline silicon layer 40 are patterned to predetermined shapes by photolithography and etching. Next, a refractory metal layer such as a titanium (Ti) layer 25 is formed in a thickness of 500 to 1500Å, preferably 1000Å, over the entire surface of silicon substrate 1 by CVD or spin coating.

Figure 7:
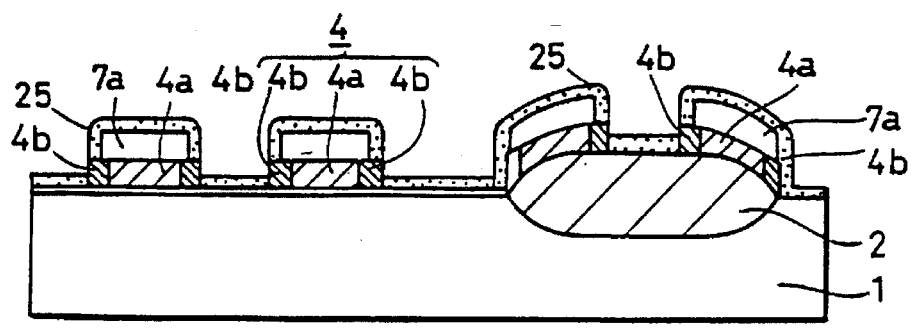

Referring to FIG. 7, a heat treatment is provided using the lamp anneal method in a nitrogen atmosphere at 600° to 900° C. for 10 to 60 seconds. This heat treatment produces a silicide reaction in regions of the titanium layer 25 contacting the surface of polycrystalline silicon layer 4a, thereby forming the titanium silicide layers 4b on the opposite side faces of each polycrystalline silicon layer 4a.

Figure 8:
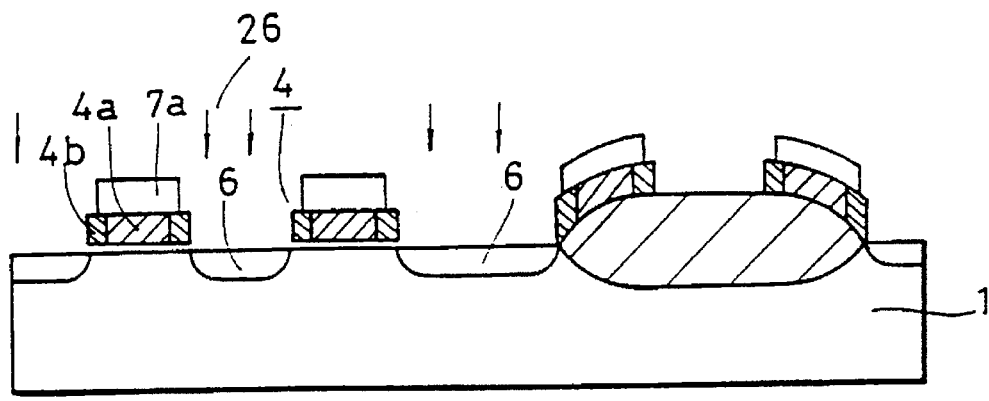

Referring to FIG. 8, unreacted parts of the titanium layer 25 contacting the upper insulating layers 7a and gate insulating layers 5 are removed by wet etching using an ($H_2SO_4+H_2O_2$) aqueous solution. Thereafter, impurities are ion-implanted into the silicon substrate 1, using the gate electrodes 4 as a mask, to form the source/drain regions 6.

Figure 9:
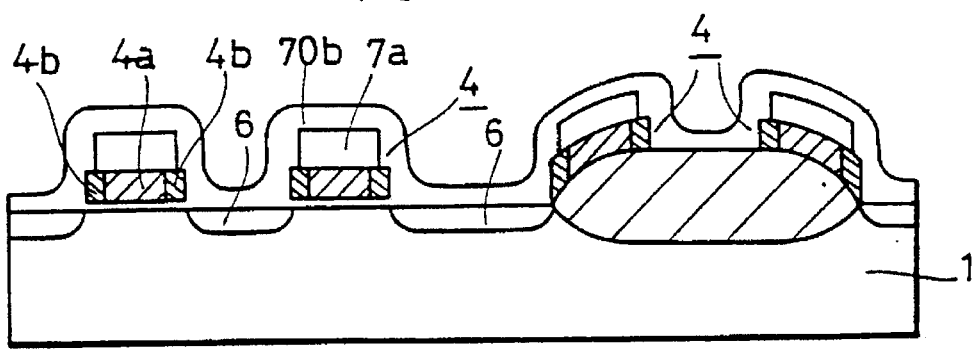

Referring to FIG. 9, an insulating layer 70b is formed of silicon oxide film or silicon nitride film over the entire surface of silicon substrate 1 by the CVD method. Then, a heat treatment is provided using the lamp anneal method in a nitrogen atmosphere at 700° to 1000° C. for 10 to 60 seconds, which stabilizes the titanium silicide layers 4b.

Figure 10:
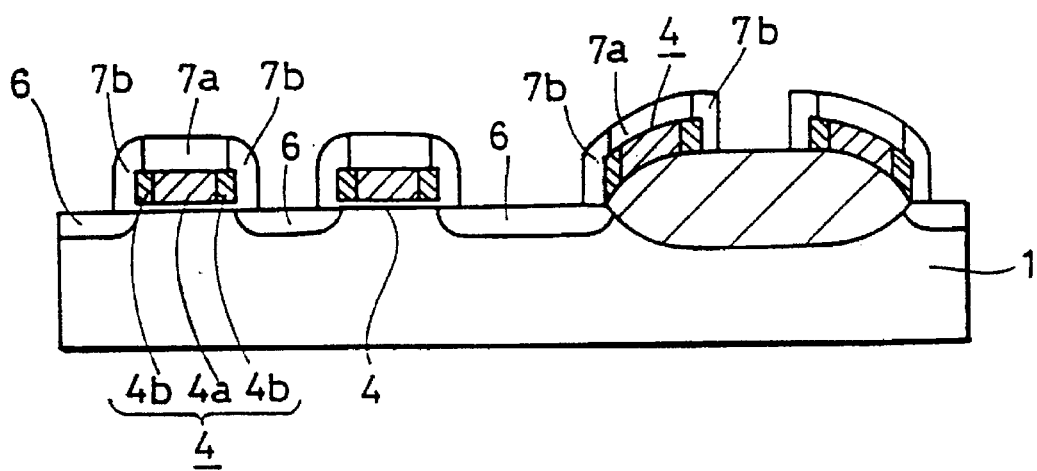

Referring to FIG. 10, the insulating layer 70b is removed except those parts thereof contacting the side walls of the gate electrodes (word lines) 4, by anisotropic etching such as reactive ion etching. As a result, the gate electrodes 4 have the upper and lateral faces thereof completely coated with the insulating layers 7a and 7b. The lateral insulating layers 7b are formed in a self-aligning manner without using a mask process or the like.

The process of manufacturing the bit lines 15 will be describe next.

Figure 16:
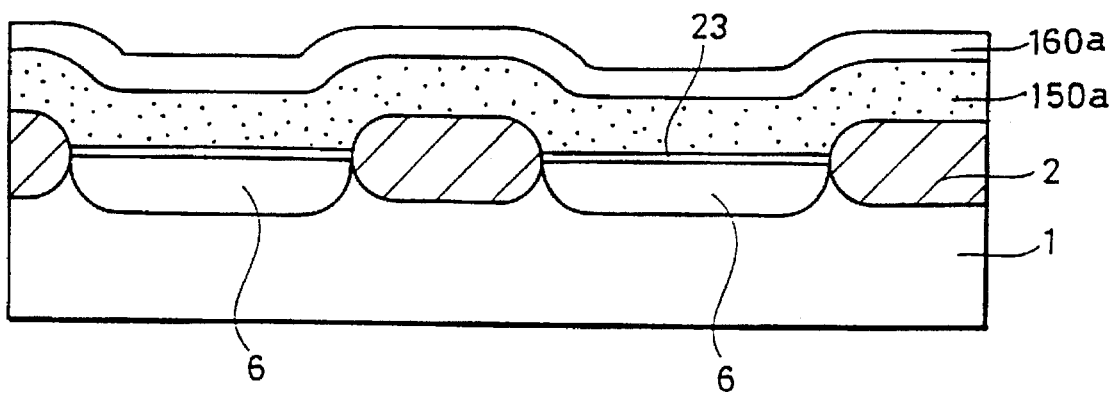
FIGS. 16 through 21 are sectional views showing a manufacturing process of the memory cells shown in FIG. 3.

Referring to FIG. 16, a bit line interlayer insulating layer 23 is formed over the entire surface of silicon substrate 1, and only the parts thereof where the bit lines 15 and source/drain regions 6 contact each other are removed. Insulating layer 23 is formed to prevent formation of a silicide layer on the silicon substrate surface in a process described later. Furthermore, insulating layer 23 prevents etching of the silicon substrate in the etching process for patterning bit lines. Further, a polycrystalline silicon layer 150a is superposed by the CVD method, and an insulating layer 160a is formed on the surface thereof.

Figure 11:
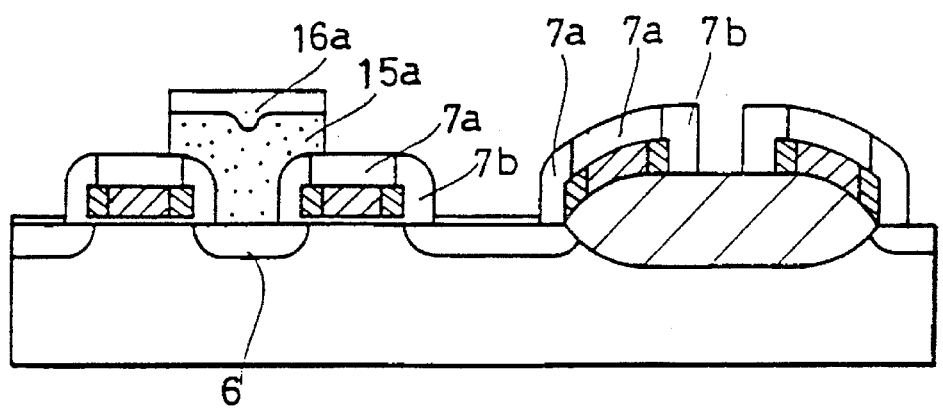
Figure 17:
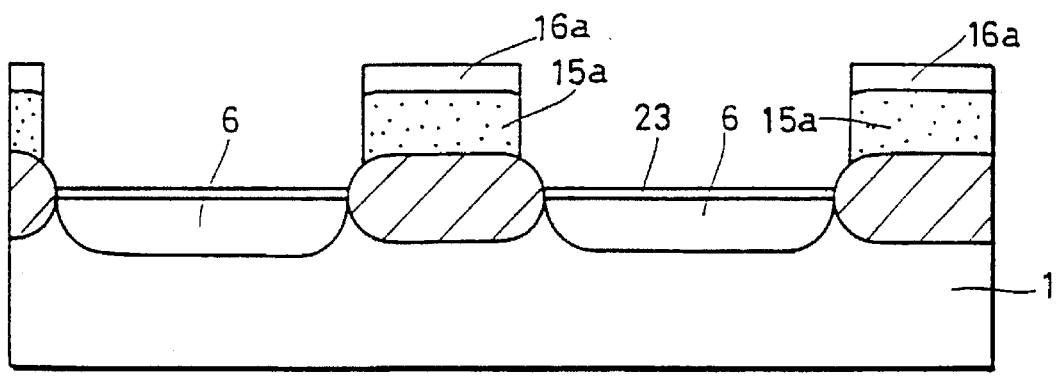

Referring to FIGS. 11 and 17 next, the insulating layer 160a and polycrystalline silicon layer 150a are patterned to predetermined shapes by photolithography and etching. As a result, the first conductive portion 15a and upper insulating layers 16a of each bit line are formed.

Figure 12:
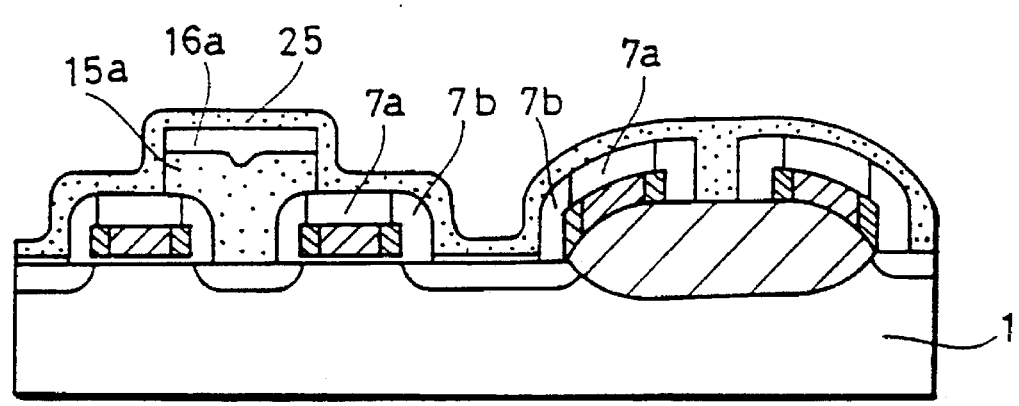
Figure 18:
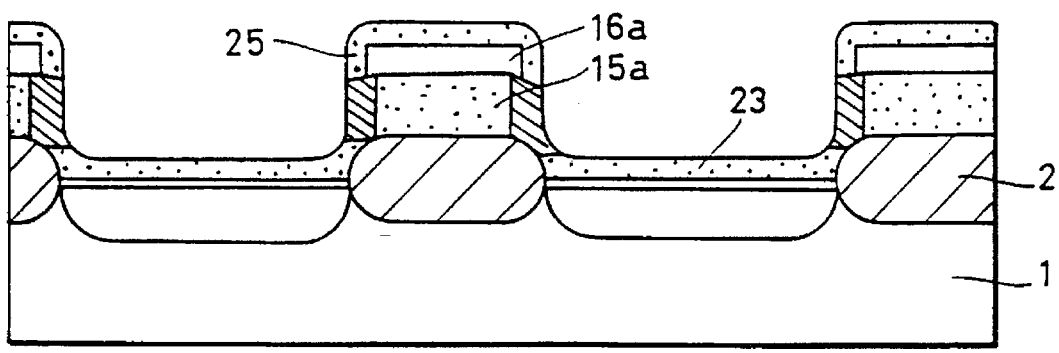

Referring to FIGS. 12 and 18, a refractory metal layer such as a titanium layer 25 is formed by spattering, CVD or spin coating.

Figure 13:
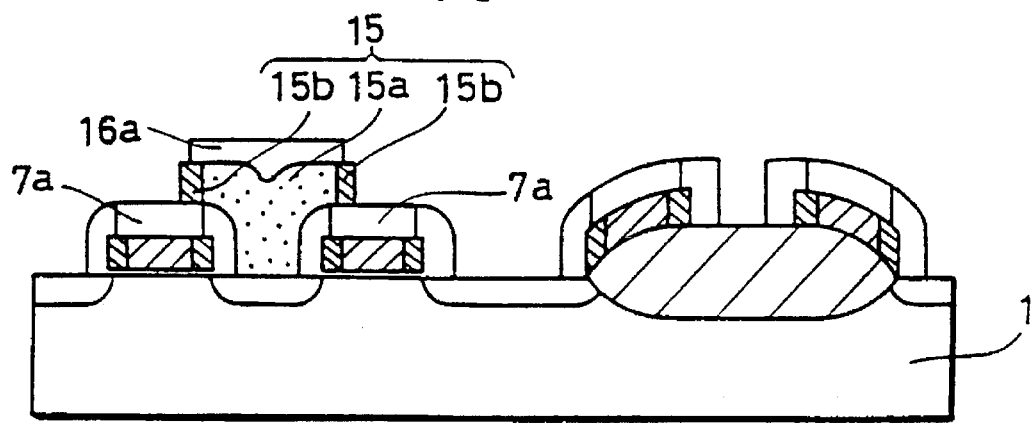
Figure 19:
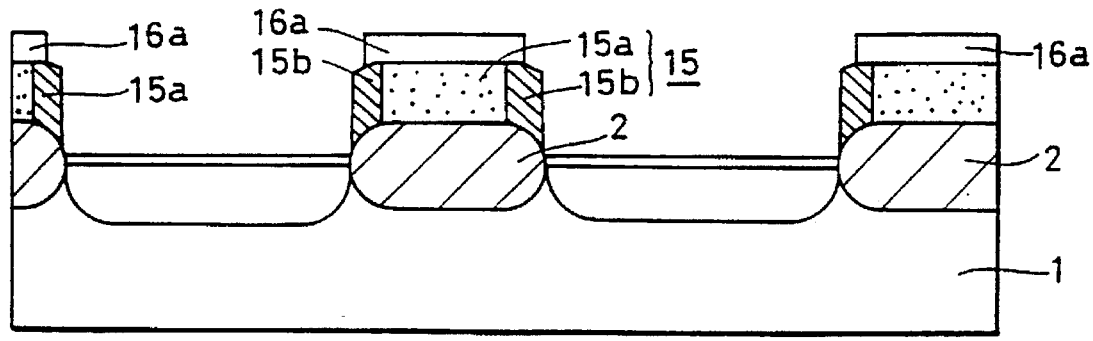

Referring to FIGS. 13 and 19, a heat treatment is provided using the lamp anneal method in a nitrogen atmosphere, thereby forming the titanium silicide layers 15b only on the lateral surfaces of first conductive portions 16a of the bit lines 15. Thereafter, unreacted parts of the titanium layer 25 are removed by wet etching.

Figure 14:
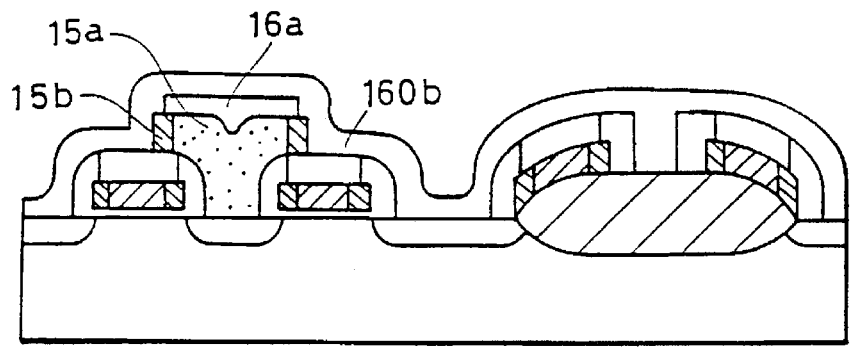
Figure 15:
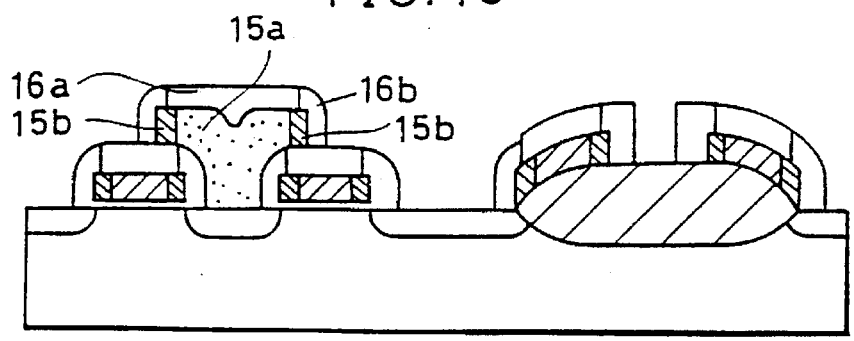
Figure 20:
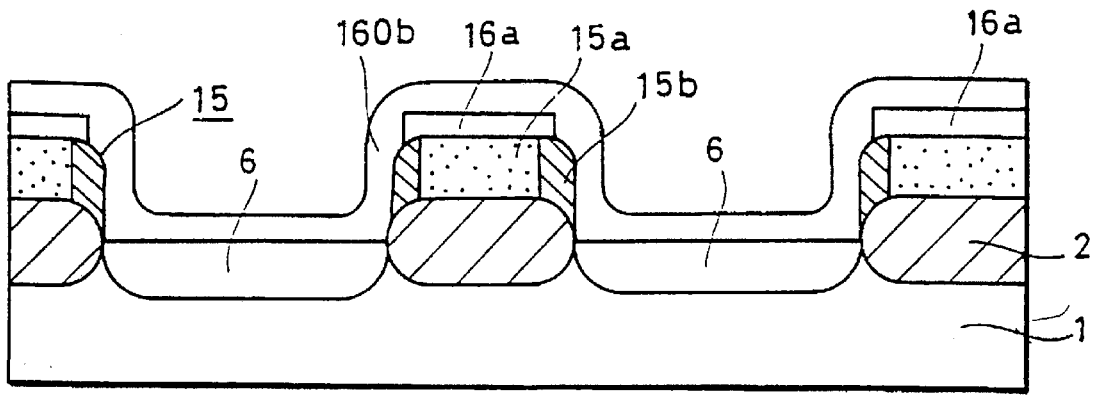
Figure 21:
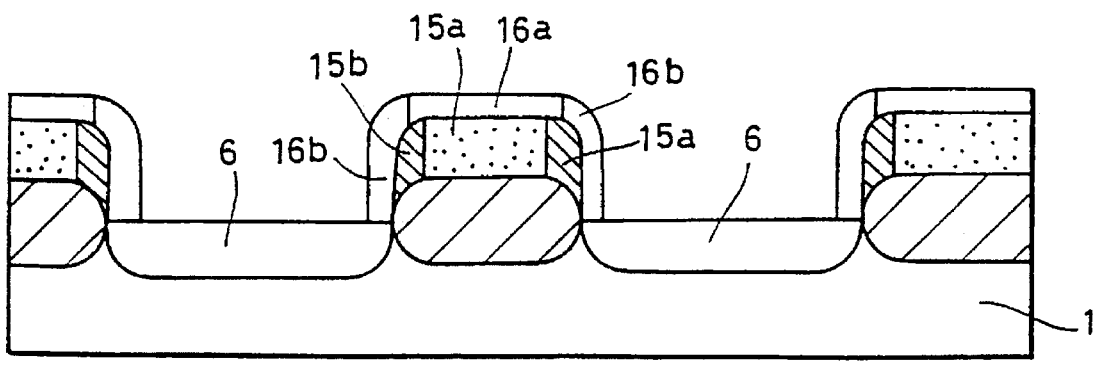
Figure 22:
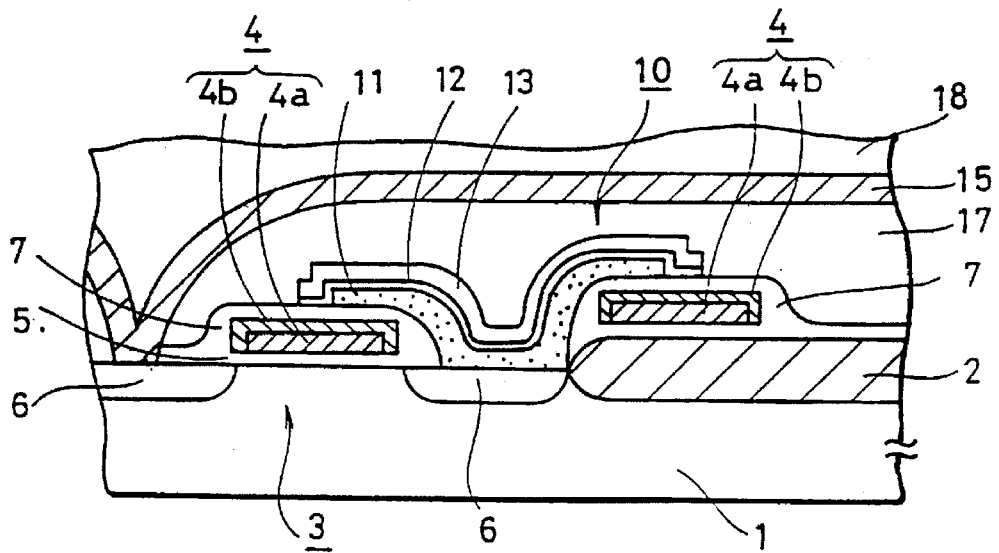
FIG. 22 is a structural section of memory cells of a conventional DRAM.
Figure 23:
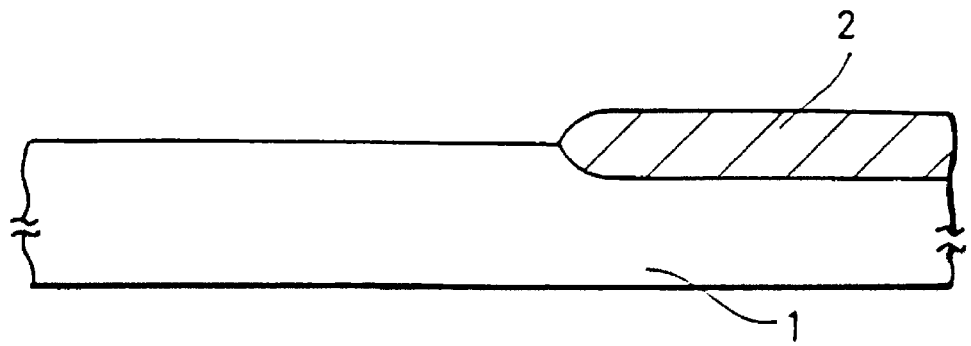
FIGS. 23 through 29 are sectional views showing a manufacturing process of the memory cells shown in FIG. 22.
Figure 24:
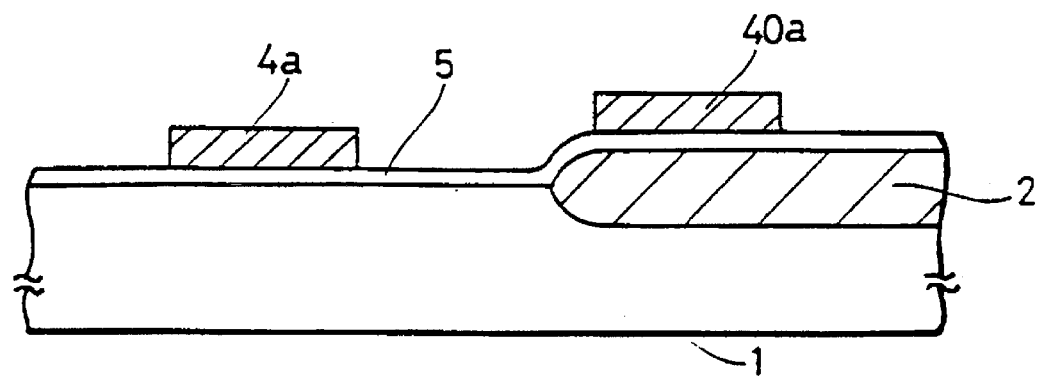
Figure 25:
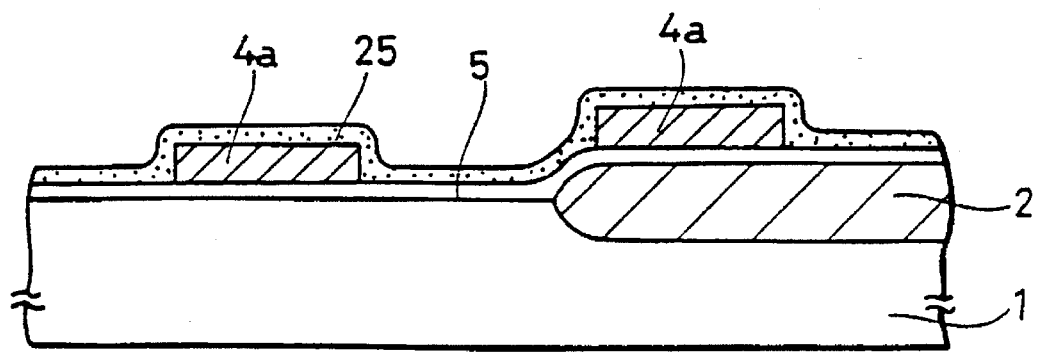
Figure 26:
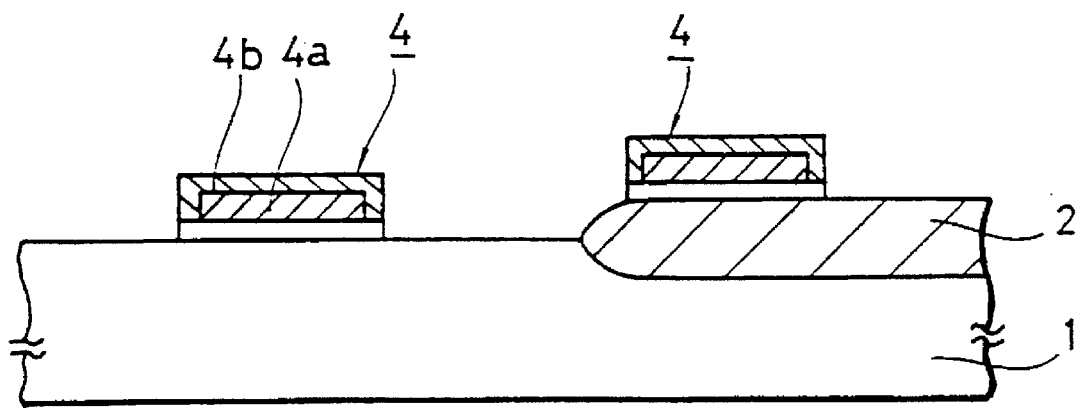
Figure 27:
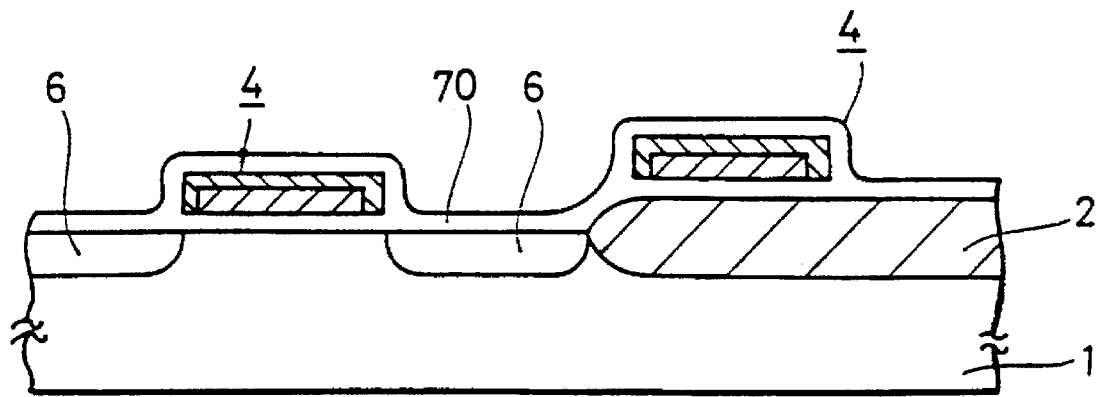
Figure 28:
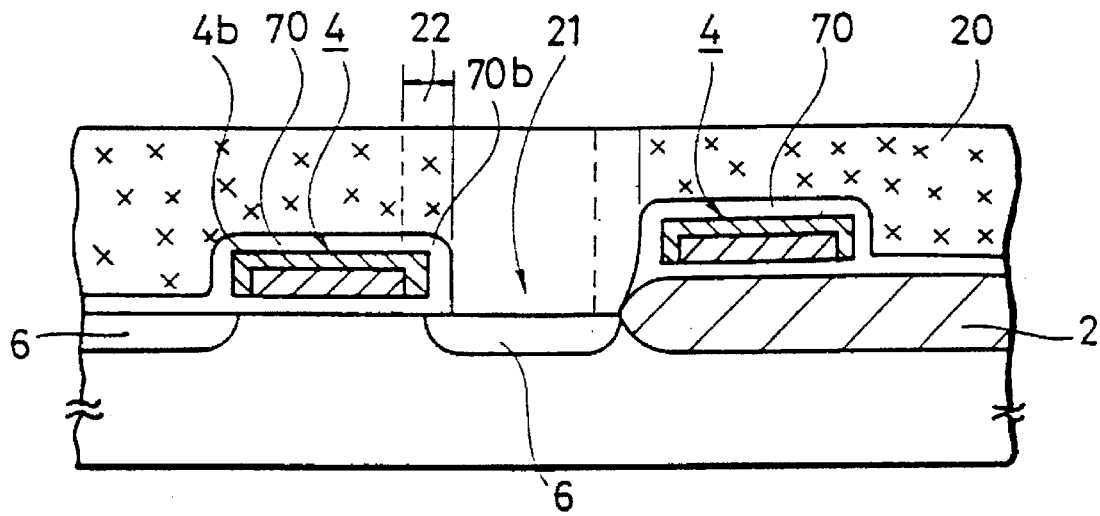
Figure 29:
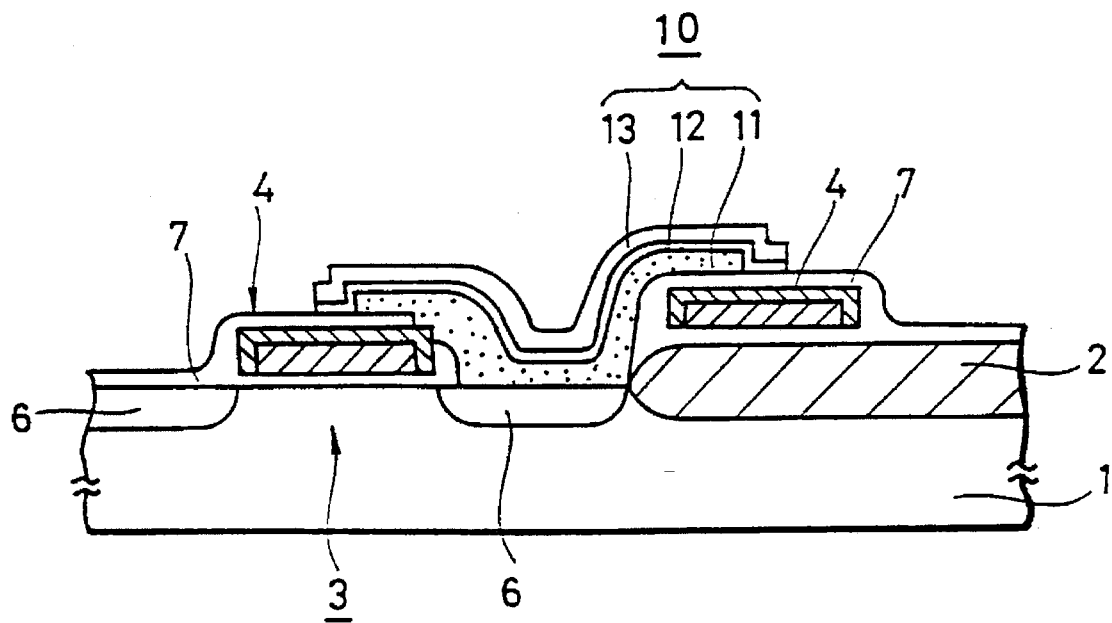

Referring to FIGS. 14 and 20, an insulating layer 160b is formed of silicon oxide film or silicon nitride film over the entire surface of silicon substrate 1 by the CVD method. Referring to FIGS. 15 and 21, the insulating layer 160b is selectively removed by anisotropic etching to form the lateral insulating layers 16b covering the lateral positions of the bit lines 15.

A process for manufacturing the capacitors is carried out subsequently, but a detailed description of this process will not be made herein.

As described above, the wiring structure according to this invention has the insulating layer divided into the upper insulating layer and lateral insulating layers and formed in a self-aligning manner for coating the conductive portions of the wiring. When forming different conductive layers over this wiring layer, the wiring layer is prevented from becoming exposed in the course of a patterning process for forming contacts in the insulating layer interposed between the two conductive layers.

As noted in the introductory part hereof, the wiring structure according to this invention is not limited to the DRAM described in the foregoing embodiment, but is applicable widely to semiconductor devices which may be subjected to similar situations.

The structure of the conductive portions of the wiring layer is not limited to the combination of polycrystalline silicon and silicide. Nor is the silicide layer limited to titanium silicide but a silicide layer of a different refractory metal may be employed.

As described above, an electrode wiring layer for a semiconductor device according to this invention has a first conductive portion, and second conductive portions formed on lateral walls of the first conductive portion, upper and lateral surfaces thereof being coated with separate insulating layers, respectively. This structure has excellent conductivity, and at the same time secures insulation, by means of these insulating layers, from conductive layers formed over this wiring layer. Consequently, the conductive portions are prevented from becoming exposed during a subsequent etching process, to assure a wiring structure having an excellent insulating property.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor memory device, which method comprises:

forming an insulating layer on a main surface of a semiconductor substrate;

forming a bit line on said insulating layer by:

forming a patterned first conductive layer of said polycrystalline silicon;

forming a similarly patterned insulating layer on said upper surface of said first conductive layer of said polycrystalline silicon; and forming a pair of second conductive layers of said refractory metal silicide contacting said first conductive layer only on said side surfaces, wherein said bit line comprises:

a first conductive layer of polycrystalline silicon formed on said insulating layer, said first conductive layer having a upper surface, a lower surface and a pair of side surfaces between said upper and lower surfaces; and a pair of second conductive layers of a refractory metal silicide formed on said insulating layer contacting said first conductive layer only at said side surfaces.

2. The method according to claim 1, wherein said refractory metal silicide is titanium metal silicide.

3. The method according to claim 1, wherein the semiconductor memory device is a DRAM device.

4. A method of manufacturing a semiconductor memory device, which method comprises:

forming an insulating layer on a main surface of a semiconductor substrate;

forming an opening in said insulating layer exposing said main surface of said semiconductor substrate; and forming a bit line on said insulating layer and contacting a conductive surface of said semiconductor substrate through said opening by:

forming a first conductive layer of polycrystalline silicon on said insulating layer contacting a conductive surface of said semiconductor substrate;

forming a second insulating layer on said first conductive layer of polycrystalline silicon;

patterning said first conductive layer of polycrystalline silicon and said second insulating layer;

depositing a refractory metal layer on said insulating layer, on said second insulating layer and on said side surfaces of said first conductive layer of polycrystalline silicon;

heating to form said refractory metal silicide layers only on said side surfaces of said first conductive layer of polycrystalline silicon; and removing the portions of said refractory metal layer not converted to refractory metal silicide; wherein, said bit line comprises a first conductive layer of polycrystalline silicon having an upper surface, a lower surface and a pair of side surfaces between said upper and lower surfaces, and a pair of second conductive layers of a refractory metal silicide formed on said insulating layer contacting said first conductive layer only on said side surfaces.

5. The method according to claim 4 wherein said refractory metal silicide is titanium silicide.

6. The method according to claim 4 wherein said semiconductor memory device is a DRAM device.

7. A method of manufacturing a semiconductor device having a field effect transistor, which method comprises:

forming a first insulating layer on a main surface of a semiconductor substrate;

forming a gate electrode on said first insulating layer;

forming a second insulating layer on said gate electrode; and forming a wiring layer extending to contact said semiconductor substrate on said second insulating layer by:

forming a polycrystalline silicon layer on said second insulating layer;

forming a third insulating layer on said polycrystalline silicon layer;

patterning said polycrystalline silicon layer and said third insulating layer so that each of said polycrystalline silicon layer and third insulating layer comprises a bottom surface, a top surface, and a pair of side surfaces between said bottom surfaces and said top surfaces, wherein said bottom surface of said third insulating layer is on said top surface of said polycrystalline silicon layer;

depositing a refractory metal layer on said second insulating layer, on said top surface of said third insulating layer, on said side surfaces of said third insulating layer and on said side surfaces of said polycrystalline silicon layer;

heating to form said refractory metal silicide layers only on said side surfaces of said polycrystalline silicon layer; and removing the portions of said refractory metal layer not converted to refractory metal silicide, said wiring layer comprising a polycrystalline silicon layer having an upper surface, a lower surface and a pair of side surfaces between said upper and lower surfaces, and a pair of refractory metal silicide layers formed in contact with said polycrystalline silicon layer only at said pair of side surfaces.

8. The method according to claim 7, wherein the refractory metal silicide is titanium silicide.

9. The method according to claim 7 wherein said semiconductor device is a DRAM device.

* * * * *